United States Patent
Yabuki

(10) Patent No.: US 11,175,239 B2
(45) Date of Patent: Nov. 16, 2021

(54) FOREIGN SUBSTANCE INSPECTION APPARATUS, PROCESSING APPARATUS, AND ARTICLE MANUFACTURING METHOD

(71) Applicant: CANON KABUSHIKI KAISHA, Tokyo (JP)

(72) Inventor: Akira Yabuki, Shimotsuga-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/667,205

(22) Filed: Oct. 29, 2019

(65) Prior Publication Data

US 2020/0141880 A1    May 7, 2020

(30) Foreign Application Priority Data

Nov. 6, 2018 (JP) .............................. JP2018-209096

(51) Int. Cl.
| | | |
|---|---|---|
| *G03F 7/20* | (2006.01) | |
| *G01N 21/94* | (2006.01) | |
| *G01N 21/47* | (2006.01) | |
| *G01N 21/95* | (2006.01) | |

(52) U.S. Cl.
CPC ......... *G01N 21/94* (2013.01); *G01N 21/4795* (2013.01); *G01N 21/9501* (2013.01); *G03F 7/7035* (2013.01); *G03F 7/7065* (2013.01); *G03F 7/70916* (2013.01)

(58) Field of Classification Search
CPC ............... G01N 21/4795; G01N 21/94; G01N 21/9501; G03F 1/84; G03F 7/7035; G03F 7/7065; G03F 7/70908; G03F 7/70916

USPC ................. 250/559.45; 355/30, 67, 68, 77; 356/237.2–237.5; 382/148, 149

See application file for complete search history.

(56) References Cited

U.S. PATENT DOCUMENTS

| | | | |
|---|---|---|---|
| 2006/0163503 A1* | 7/2006 | Urano | ..................... G01N 21/47 |
| | | | 250/559.42 |
| 2007/0259290 A1* | 11/2007 | Okita | ..................... G03F 7/7065 |
| | | | 430/312 |
| 2015/0260659 A1* | 9/2015 | Chuang | ............. H01L 27/14685 |
| | | | 250/370.08 |

FOREIGN PATENT DOCUMENTS

| | | |
|---|---|---|
| JP | 1-320585 A | 12/1989 |
| JP | 2001-235429 A | 8/2001 |
| JP | 2009-293953 A | 12/2009 |
| JP | 2013-224957 A | 10/2013 |

\* cited by examiner

*Primary Examiner* — Colin W Kreutzer
(74) *Attorney, Agent, or Firm* — Canon U.S.A., Inc. IP Division

(57) ABSTRACT

A foreign substance inspection apparatus according to the present invention detects a foreign substance on a substrate, and includes a detection unit that includes a light projector configured to project light to a surface of the substrate and a light receiver configured to receive scattered light from the surface, an adjustment mechanism configured to adjust a light quantity of the scattered light received by the light receiver, and a control unit configured to perform foreign substance detection in a state where sensitivity of the detection unit is changed to low sensitivity, after performing foreign substance detection in a state where the sensitivity of the detection unit is set to high sensitivity by adjusting the light quantity of the scattered light received by the light receiver.

14 Claims, 8 Drawing Sheets

FOREIGN SUBSTANCE INSPECTION APPARATUS, PROCESSING APPARATUS, AND ARTICLE MANUFACTURING METHOD

BACKGROUND

Field of the Disclosure

The present disclosure relates to a foreign substance inspection apparatus, a processing apparatus, and an article manufacturing method.

Description of the Related Art

An article including a fine structure, for example, a semiconductor device or a micro-electronic-mechanical system (MEMS) is manufactured by a projection exposure apparatus and a forming apparatus such as an imprint apparatus. In such a forming apparatus, if a foreign substance is present on a substrate, the foreign substance may cause defect of the manufactured article. Further, in the imprint apparatus, an imprint material on a substrate is formed through contact of the imprint material and a mold. Therefore, the foreign substance present on the substrate may damage the mold or shorten the life of the mold.

Accordingly, a foreign substance inspection apparatus that inspects the foreign substance on the substrate can be used. The foreign substance inspection apparatus applies light to the substrate, and receives light scattered from the foreign substance by a light receiver, thereby detecting the foreign substance. For example, to detect a fine foreign substance having a size of several tens nm, a light receiver having extremely high sensitivity, for example, a photomultiplier tube can be used. In the photomultiplier tube, electrons generated in a photoelectric cathode caused by incidence of light are accelerated by high voltage, and the electrons are brought into collision with a plurality of stages of dynodes for generation of secondary electrons. A current accumulated until the electrons pass through the dynode in the final stage is collected in an anode as an amplified signal. The photomultiplier tube can detect extremely weak light; however, if the size of the foreign substance on the substrate is large and strong reflected light enters the photomultiplier tube, an output of the photomultiplier tube saturates for a relatively long time, and the size of the foreign substance cannot be accurately detected.

In an exposure apparatus discussed in Japanese Patent Application Laid-Open No. 2001-235429, a plurality of detection systems different in sensitivity is provided to achieve both high sensitivity and a wide dynamic range.

In a case where the existing foreign substance inspection apparatus is incorporated in the exposure apparatus, however, the apparatus may be upsized because it is difficult to provide, in a limited layout space, the plurality of detection systems having extremely high sensitivity in order to detect a fine foreign substance having a size of several tens nm. Further, if the sensitivity of the detection system is changed at each foreign substance inspection to perform measurement a plurality of times, the measurement takes a long time, which may impair productivity of the forming apparatus.

SUMMARY

According to an aspect of the present invention, A foreign substance inspection apparatus that detects a foreign substance on a substrate, includes a detection unit including a light projector configured to project light to a surface of the substrate, and a light receiver configured to receive scattered light from the surface, an adjustment mechanism configured to adjust a light quantity of the scattered light received by the light receiver, and a control unit configured to perform foreign substance detection in a state where sensitivity of the detection unit is set to high sensitivity by the adjustment mechanism adjusting the light quantity of the scattered light received by the light receiver, and to determine whether to perform foreign substance detection in a state where the sensitivity of the detection unit is changed to low sensitivity by the adjustment mechanism, based on a result of the foreign substance detection at high sensitivity.

Further features of the present invention will become apparent from the following description of exemplary embodiments with reference to the attached drawings.

DESCRIPTION OF THE EMBODIMENTS

Figure 1:
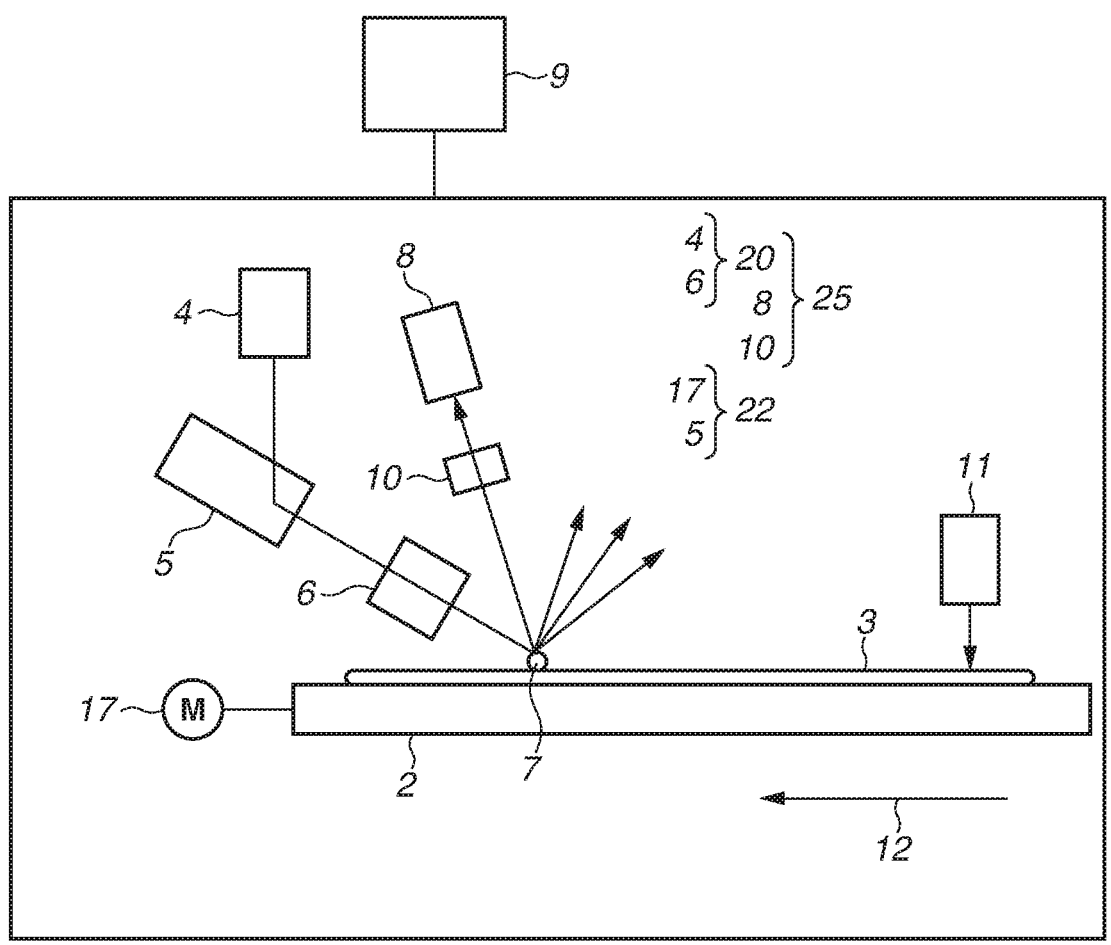
FIG. 1 is a side view illustrating a foreign substance inspection apparatus according to a first exemplary embodiment of the present invention.

An exemplary embodiment of the present invention will be described in detail below with reference to the accompanying drawings. In the drawings, the same members are denoted by the same reference numerals, and overlapped description is omitted.

Figure 2:
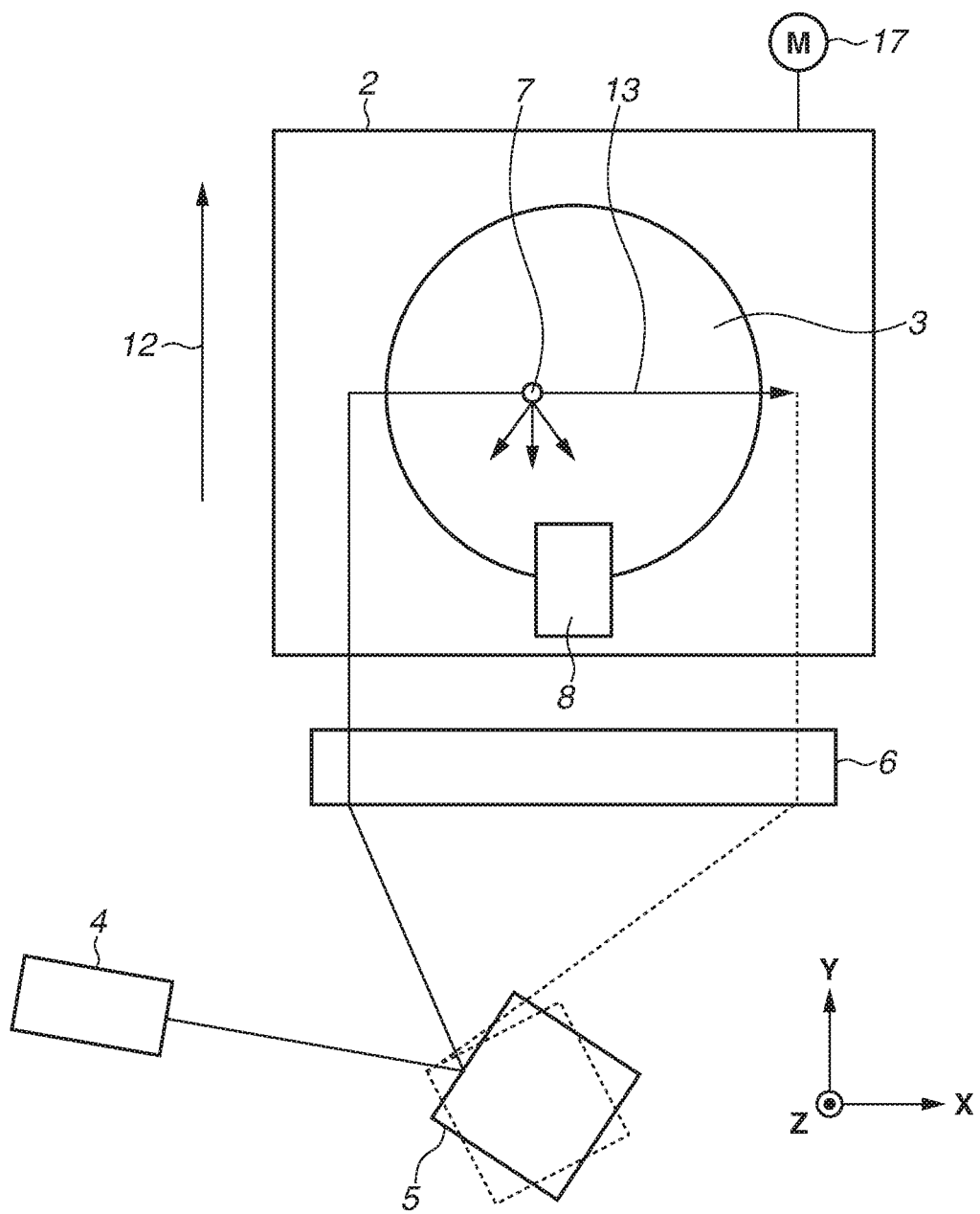
FIG. 2 is a plan view illustrating the foreign substance inspection apparatus according to the first exemplary embodiment of the present invention.

FIG. 1 and FIG. 2 each illustrate a configuration of a foreign substance inspection apparatus 1 according to a first exemplary embodiment of the present invention. FIG. 1 is a side view, and FIG. 2 is a plan view. In the following description, the configuration of the foreign substance inspection apparatus 1 is described based on an XYZ coordinate system in which a plane parallel to a surface of a substrate 3 is an XY plane. Typically, the XY plane is a horizontal plane, and a Z axis is perpendicular to the XY plane.

The foreign substance inspection apparatus 1 performs a foreign substance detection processing to detect a foreign substance 7 present on the surface of a substrate 3. The foreign substance inspection apparatus 1 may include a detection unit 25, a scanning mechanism 22, and a control unit 9. The detection unit 25 may include a light projector 20 that projects light to the surface of the substrate 3, a light receiver 8 that receives scattered light from the surface of the substrate 3, and an adjustment mechanism 10 that adjusts a light quantity. The scanning mechanism 22 scans a position (incident position of light to substrate 3) on the surface of the substrate 3 at which the light is projected by the projector 20.

The light projector 20 may include, for example, a light source 4 and a light projecting optical system 6. The light source 4 emits light to be projected to the surface of the substrate 3. The light source 4 may include, for example, a laser light source. When the foreign substance inspection apparatus 1 is used as an apparatus that inspects the surface of the substrate 3 coated with a photosensitive material, the light source 4 emits light having a wavelength causing no effect on the photosensitive material. For example, light used by the imprint apparatus to cure the photosensitive material (imprint material) may be ultraviolet (UV) light. Accordingly, in a case where the foreign substance inspection apparatus 1 is incorporated in the imprint apparatus or in a case where the foreign substance inspection apparatus 1 is used for the imprint apparatus, the wavelength of the light emitted from the light source 4 is 400 nm or more (light of wavelength different from light used to cure the imprint material). It is desirable that the light source 4 can change intensity of the emitting light based on an applied process condition (e.g., reflectance ratio of surface of substrate 3 at wavelength of light emitted from light source 4). Using a semiconductor laser as the light source 4 enables on/off control at a frequency of, for example, 100 MHz or more. The light projecting optical system 6 may include, for example, an fθ lens.

The light receiver 8 may include, for example, a light receiving device that receives scattered light from the surface of the substrate 3 or a foreign substance, and may include a photomultiplier tube. Further, the light receiver 8 may include the adjustment mechanism 10. The adjustment mechanism 10 may include, for example, a neutral density (ND) filter. The adjustment mechanism 10 can adjust the quantity of the light entering the light receiver 8 by inserting or extracting the ND filter or switching a plurality of ND filters different in transmittance. In the present exemplary embodiment, the adjustment mechanism 10 that adjusts the quantity of the light that is scattered by the substrate 3 or the foreign substance 7 and then enters the light receiver 8 is described; however, the adjustment mechanism 10 may be disposed on another place. For example, the adjustment mechanism 10 may be disposed between the light source 4 and the substrate 3 in order to adjust the quantity of the light emitted from the light source 4. Controlling the adjustment mechanism 10 in the above-described manner makes it possible to switch measurement in a high-sensitivity mode and measurement in a low-sensitivity mode in a measurement process described below.

The scanning mechanism 22 may include, for example, a polygon mirror unit (scanning optical system) 5 and a stage driving mechanism (stage scanning mechanism) 17. The polygon mirror unit 5 includes a polygon mirror, and rotates the polygon mirror at optional constant speed, thereby performing scanning with light. The stage driving mechanism 17 drives (scans) a stage (substrate holding unit) 2 holding the substrate 3 at least in a Y-axis direction. The stage driving mechanism 17 may further drive the stage 2 in the other direction, for example, in an X-axis direction and/or around the Z axis. In this example, the scanning mechanism 22 performs scanning in the X-axis direction by the polygon mirror unit 5, and performs the scanning in the Y-axis direction by the stage driving mechanism 17. Alternatively, for example, both of the scanning in the X-axis direction and the Y-axis direction may be performed by an optical system including the polygon mirror unit 5 or by the stage driving mechanism 17.

The light emitted from the light source 4 to the polygon mirror of the polygon mirror unit 5 is reflected by the polygon mirror. Since the polygon mirror needs to rotate at a speed, for example, at 10000 rotations/minute to 300000 rotations/minute, an air bearing excellent in durability can be used as a bearing for supporting the polygon mirror. The light reflected by the polygon mirror may be projected to the substrate 3 through the light projecting optical system 6. In this way, the constant rotational motion of the polygon mirror can be converted into constant linear motion of a spot moving on a focal plane of the substrate 3. Further, as the fθ lens of the light projecting optical system 6, a telecentric lens that can perpendicularly apply light to the focal plane can be used. In FIG. 2, a light scanning direction 13 indicates a scanning direction and a locus of the converted constant linear motion. Further, in FIG. 2, a stage scanning direction 12 indicates the scanning direction and the locus of the stage 2. The light scanning direction 13 is orthogonal to the stage scanning direction 12.

The foreign substance 7 adhering to the surface of the substrate 3 may be, for example, a particle having the minimum particle diameter of several tens nm or more. When the light is applied from the light projector 20 to the foreign substance 7, scattered light is generated from the foreign substance 7. The light receiver 8 may be disposed so as to detect light reflected backward by the foreign substance 7 or light reflected toward a side by the foreign substance 7. For example, glass, ceramics, metal, semiconductor, or resin is used for the substrate, and a member made of a material different from the material of the substrate may be provided on the surface of the substrate as necessary. More specifically, the substrate includes a silicon wafer, a compound semiconductor wafer, quartz glass, or the like.

The control unit 9 may perform, for example, positioning control of the stage 2 (control of stage driving mechanism 17), on/off control of the light source 4, control of the polygon mirror unit 5, and control of the adjustment mechanism 10. The control unit 9 may further perform digital signal processing after converting a continuous analog electric signal output from the light receiver 8 into a digital signal. The digital signal processing may include, for example, processing to determine a centroid position of a light intensity signal of Gaussian distribution obtained by the scattered light from the foreign substance 7. Further, the digital signal processing may include processing to calculate a coordinate of each foreign substance based on a central coordinate (0, 0) of the substrate 3, from the centroid position, the number of scanning times with light by the polygon mirror unit 5 corresponding to the position of the stage 2, and the data sampling number from a start position of the scanning with light. The number of scanning times with light corresponds to the position in the Y-axis direction, and the data sampling number from the start position of the scanning with light corresponds to the position in the X-axis direction. Further, the digital signal processing may include processing to determine a particle diameter of the foreign substance 7 from a peak value and a width of the obtained intensity distribution. The control unit 9 can perform surface inspection based on the output from the light receiver 8 in the above-described manner.

The control unit 9 may be configured of, for example, a programmable logic device (PLD) such as a field programmable gate array (FPGA), an application specific integrated circuit (ASIC), a general-purpose computer having a program, or a combination of all or a part thereof. The control unit 9 may be provided inside the foreign substance inspection apparatus 1, or may be installed at a position separated from the foreign substance inspection apparatus 1 and may perform remote control.

The foreign substance inspection apparatus 1 may include a measurement unit 11 (alignment scope) that measures a position of an alignment mark of the substrate 3. Further, the foreign substance inspection apparatus 1 may include a measurement unit that measures a height of the surface of the substrate 3. The measurement unit that measures the height of the surface of the substrate 3 may include a non-contact sensor, for example, a reflective laser displacement meter that can measure a mirror surface.

Figure 3:
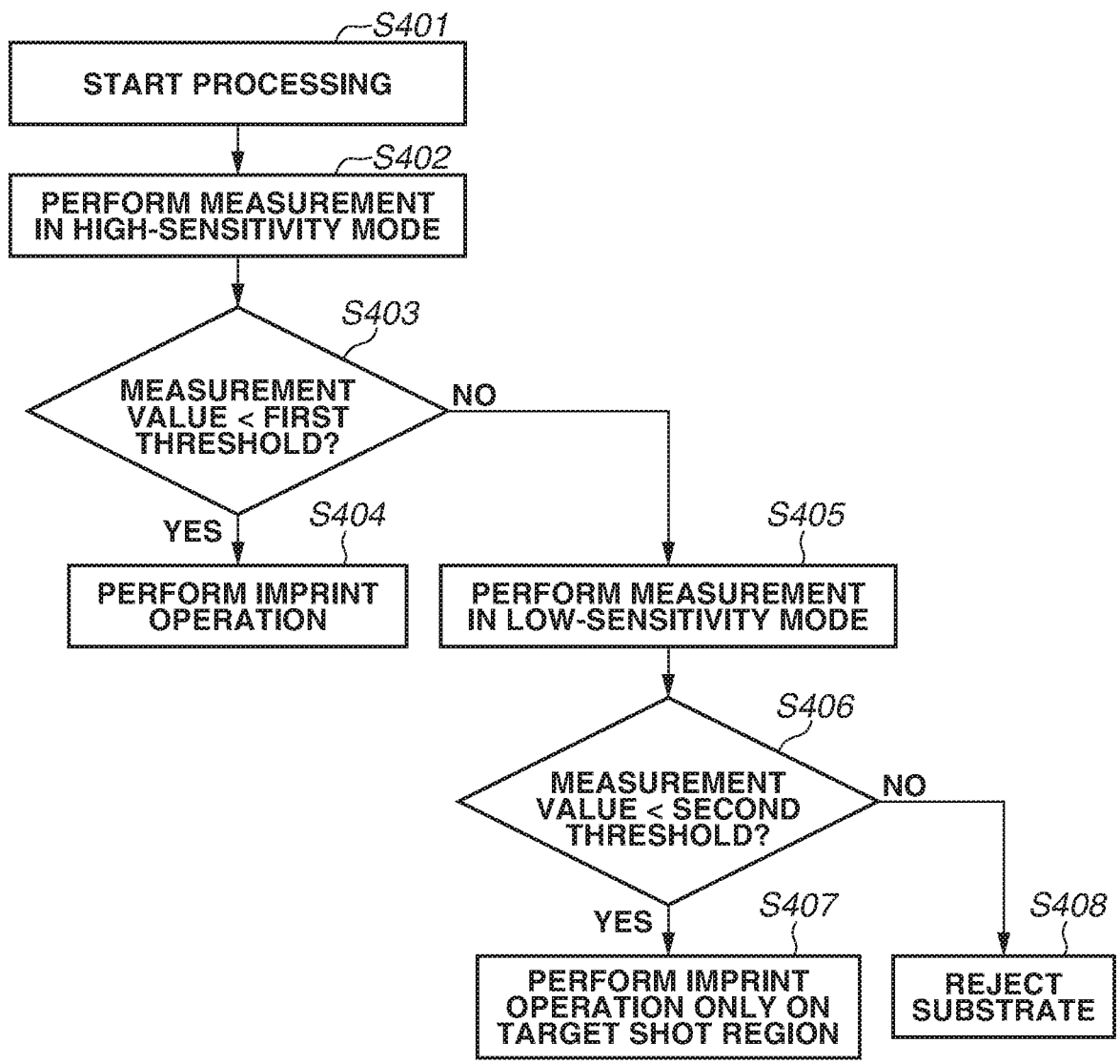
FIG. 3 is a flowchart illustrating a foreign substance inspection method according to the first exemplary embodiment.

The operation of the foreign substance inspection apparatus 1 is described as an example below with reference to FIG. 3. FIG. 3 is a flowchart illustrating a foreign substance inspection method by the foreign substance inspection apparatus according to the present exemplary embodiment. The operation of inspection processing by the foreign substance inspection apparatus 1 may be controlled by the control unit 9.

The control unit (signal processing unit) 9 includes a unit that changes detection sensitivity, and the foreign substance inspection apparatus 1 starts sequence control in step S401. First, in step S402, the foreign substance inspection apparatus 1 performs measurement of the scattered light in the high-sensitivity mode. In step S402, positions of a plurality of alignment marks of the substrate 3 are first measured by the measurement unit 11, and the position (Xref, Yref, Qzref) of the substrate 3 is calculated by the control unit 9 based on a result of the measurement, where Xref is a position in the X-axis direction, Yref is a position in the Y-axis direction, and Qzref is rotation around the Z-axis. At this time, the height of the surface of the substrate 3 may be measured.

Next, in step S402, the control unit 9 sets sensitivity of the detection unit 25 to high sensitivity in order to enable the light receiver 8 to detect scattered light from a fine foreign substance over the entire region of the surface of the substrate 3. The sensitivity of the detection unit 25 may be set through setting of output intensity of the light source 4 (intensity of light emitted by light source 4) or through setting of sensitivity of the light receiver 8 or both of them. Further, to set the sensitivity, the adjustment mechanism 10 such as an ND filter may be disposed in an optical path from the light source 4 to the substrate 3 and/or an optical path from the substrate 3 (foreign substance 7) to the light receiver 8.

In step S402, the measurement process to measure the reflected light of the light from the light projector 20 is performed on the entire region of the surface of the substrate 3. The measurement process may include processing to save a signal I obtained from an output of the light receiver 8 when the scanning mechanism 22 is operated while the light projector 20 projects light to the surface of the substrate 3, in association with the position (Xref, Yref) on the surface of the substrate 3. More specifically, the control unit 9 detects a foreign substance on the surface of the substrate 3 while controlling light projection (turning-on and turning-off of light source 4) by the light projector 20 based on light projection control data. The signal I obtained from the output of the light receiver 8 may be saved in association not only with the coordinates on the surface of the substrate 3 but also with positions of a plurality of shot regions formed on the substrate 3.

Figure 4:
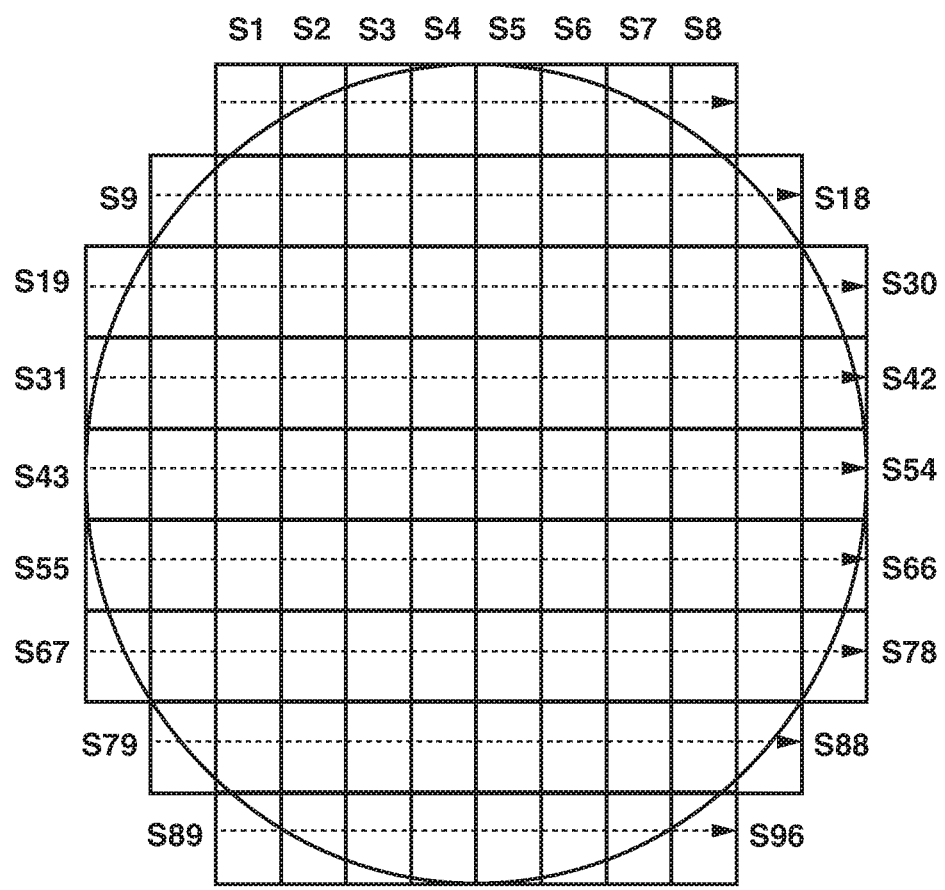
FIG. 4 is a diagram illustrating a layout of shot regions on a substrate.

For example, as illustrated in FIG. 4, the foreign substance detection processing on the substrate 3 can be performed while scanning sequentially on the plurality of shot regions formed on the substrate 3. FIG. 4 is a diagram illustrating a layout of the shot regions formed on the substrate 3. FIG. 4 includes shot regions S1 to S96. Further, dotted arrows each indicate the scanning direction in which light is applied to detect a foreign substance. As described above, sequentially applying light to the shot regions makes it possible to associate the position where the scattered light is generated, with the position of the shot region formed on the substrate 3. Although FIG. 4 illustrates the example in which the foreign substance is inspected by performing scanning once on the shot regions, the foreign substance may be inspected by performing scanning a plurality of times on one shot region depending on an application area of the light projector 20.

An interval of a measurement position (X, Y) may be determined based on, for example, the light scanning speed of the polygon mirror unit 5, the scanning speed of the stage 2 by the stage driving mechanism 17, and a frequency of frequency modulation controllable by the light source 4. For example, in a case where the light scanning speed of the polygon mirror unit 5 is 700 m/sec, and the frequency of the frequency modulation by the light source 4 is 100 MHz (0.01 μsec), the minimum pitch in the X-axis direction is 7 μm. Further, in a case where the scanning speed of the stage 2 is 20 mm/sec, and the light scanning frequency is 1500 Hz, the minimum pitch in the Y-axis direction is 13.3 μm.

In step S403, an inspection process to inspect a foreign substance on the substrate 3 is performed. The control unit 9 controls the foreign substance detection processing to perform detection of a foreign substance on the surface of the substrate 3. More specifically, the control unit 9 compares the measurement value in the high-sensitivity mode measured in step S402 with a preset threshold, thereby detecting a foreign substance.

In a case where the measurement value does not exceed a first threshold in step S403 (YES in step S403), the processing proceeds to step S404. In this case, the substrate is regarded as a substrate (region) where no foreign substance is present, and normal lithography operation can be performed on the substrate in step S404. The first threshold may be set based on a measurement value at which a foreign substance having the minimum size detectable by the foreign substance inspection apparatus 1 according to the present exemplary embodiment is detected, or based on a measurement value of a foreign substance that does not influence pattern formation on the substrate by a forming apparatus.

In a case where the measurement value exceeds the first threshold in step S403 (NO in step S403), the processing proceeds to step S405. In this case, the substrate is regarded as a substrate (region) where a foreign substance is present, and the inspection process to inspect the foreign substance on the substrate 3 in the low-sensitivity mode is performed in step S405.

In step S405, the measurement process to measure the reflected light of the light from the light projector 20 is performed on the entire region of the surface of the substrate 3. The measurement process in step S405 is performed at lower sensitivity than the process in step S402. As with the process in step S402, the measurement process may include processing to save the signal I obtained from the output of the light receiver 8 when the scanning mechanism 22 is operated while the light projector 20 projects light to the surface of the substrate 3, in association with the position (Xref, Yref) on the surface of the substrate 3. More specifically, the control unit 9 detects a foreign substance on the surface of the substrate 3 while controlling light projection (turning-on and turning-off of light source 4) by the light projector 20 based on the light projection control data. The signal I obtained from the output of the light receiver 8 may be saved in association not only with the coordinates on the surface of the substrate 3 but also with the positions of the plurality of shot regions formed on the substrate 3. Further, the measurement may be performed only on the position where the foreign substance has been detected in step S403.

Since the measurement process in step S405 is performed at lower sensitivity than the measurement process in step S402, the adjustment mechanism 10 adjusts the light quantity by reducing the light quantity of the light source 4 or reducing the light quantity entering the light receiver 8.

In step S406, the inspection process to inspect a foreign substance on the substrate 3 is performed. As with the process in step S403, the control unit 9 controls the foreign substance detection processing to perform detection of a foreign substance on the surface of the substrate 3. More specifically, the control unit 9 compares the measurement value in the low-sensitivity mode measured in step S405 with a preset threshold, thereby detecting a foreign substance.

In a case where the measurement value does not exceed a second threshold in step S406 (YES in step S406), the processing proceeds to step S407. In this case, a region (shot region) where imprint operation is to be performed is specified based on the position of the foreign substance detected in the high-sensitivity mode, and imprint operation is performed on the region.

In a case where the measurement value exceeds the second threshold in step S406 (NO in step S406), the processing proceeds to step S408. In this case, the substrate is regarded as a substrate (region) where a foreign substance is present. When a pattern is formed on the region of the substrate by the forming apparatus, a desired pattern may not be obtained. Accordingly, in step S408, the substrate may be carried out from the forming apparatus, or may be subjected to processing to remove the foreign substance adhering to the substrate.

The second threshold set in step S406 may be set in order to detect the foreign substance larger than the foreign substance to be detected by the first threshold set in step S403. Accordingly, in the case where the measurement value does not exceed the second threshold in step S406 (YES in step S406), the substrate is regarded as a substrate (region) where no foreign substance is present, and normal lithography operation can be performed on the substrate in step S407. The second threshold may be set based on the measurement value at which a foreign substance having the minimum size detectable by the foreign substance inspection apparatus 1 according to the present exemplary embodiment is detected, or based on a measurement value of a foreign substance that does not influence pattern formation on the substrate by the forming apparatus. In a case where the measurement value exceeds the second threshold in step S406, the substrate is regarded as a substrate (region) where a foreign substance is present, and the substrate can be rejected in step S408.

As described above, the measurement in the low-sensitivity mode is performed after the position of the foreign substance on the substrate is determined by the measurement in the high sensitivity mode. This makes it possible to determine whether the foreign substance influences the pattern formation by the forming apparatus. Further, performing the inspection processing before the substrate is carried into the forming apparatus (lithography apparatus) makes it possible to determine whether to carry the substrate into an imprint operation space, based on the threshold determination in the low-sensitivity mode. Further, as a result of the substrate determination, a substrate for which it is determined that the surface state of the substrate is unsuitable for the lithography because of presence of the foreign substance, can be previously rejected (excluded from target of imprint processing).

A substrate without adhesion of a foreign substance is basically carried into the forming apparatus. Typically, probability that the measurement value of the scattered light exceeds the first threshold is extremely low even in the high-sensitivity mode. Accordingly, even if the measurement value exceeds the threshold and the measurement is performed again in the low-sensitivity mode, throughput is not significantly lowered. Thus, determination of the foreign substance having the minimum particle diameter and rejection determination of a wafer can be performed by one scattered light detection system.

Figure 5:
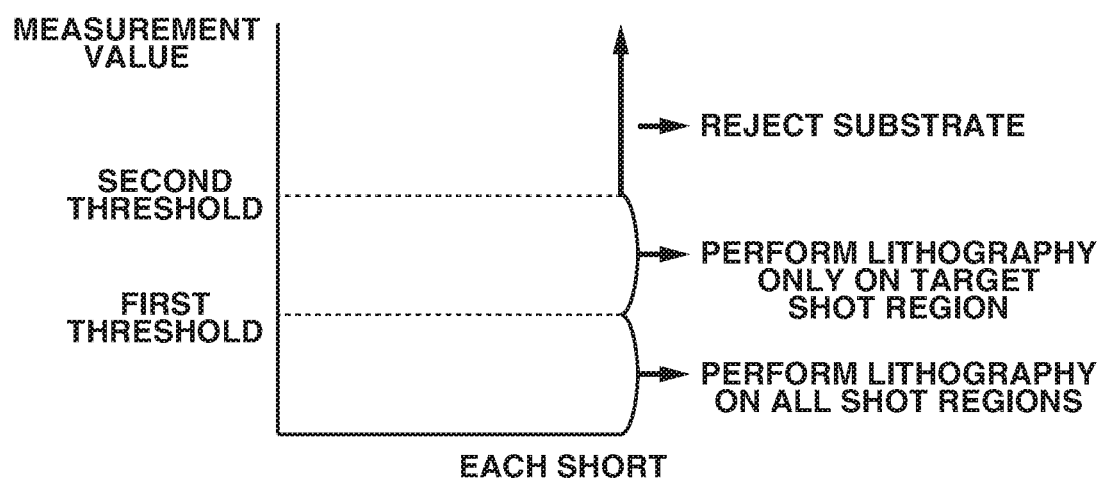
FIG. 5 is a diagram illustrating a difference between a first threshold and a second threshold, and processing after determination.

FIG. 5 is a diagram illustrating a difference between the first threshold and the second threshold with respect to the measurement value, and processing after the determination. It is possible to determine whether to perform lithography on all of the shot regions, from the determination using the first threshold. Further, it is possible to determine whether to perform lithography only on a shot region with no possibility that a large foreign substance is caught and pressed, or to reject the substrate, from the determination using the second threshold. In other words, as illustrated in FIG. 5, presence/absence of a foreign substance is determined through comparison of the measurement value measured first in the high-sensitivity mode with the first threshold. When the measurement value is smaller than the first threshold, lithography (imprint operation) can be performed on all of the shot regions. When the measurement value exceeds the first threshold, the rejection determination of the substrate is performed through comparison of the measurement value measured in the low-sensitivity mode with the second threshold. When the measurement value exceeds the second threshold, the substrate can be rejected from the forming apparatus. Further, when the measurement value in the high-sensitivity mode exceeds the first threshold but the measurement value in the low-sensitivity mode does not exceed the second threshold, lithography (imprint operation) can be performed only on a target shot region where the lithography can be performed.

As described above, the foreign substance inspection apparatus according to the present exemplary embodiment can determine the measurement value exceeding the first threshold and the measurement value exceeding the second threshold for each of the shot regions with the wide measurement range by measuring the scattered light in two modes of the high-sensitivity mode and the low-sensitivity mode.

Further, in the case where the imprint apparatus that uses a mold to form a pattern on the imprint material on the substrate is used as the forming apparatus, detecting the position, on the substrate, of the foreign substance influencing the mold makes it possible to prevent breakage of the mold caused by contact of the mold and the foreign substance.

<Forming Apparatus and Foreign Substance Inspection Apparatus>

Figure 6:
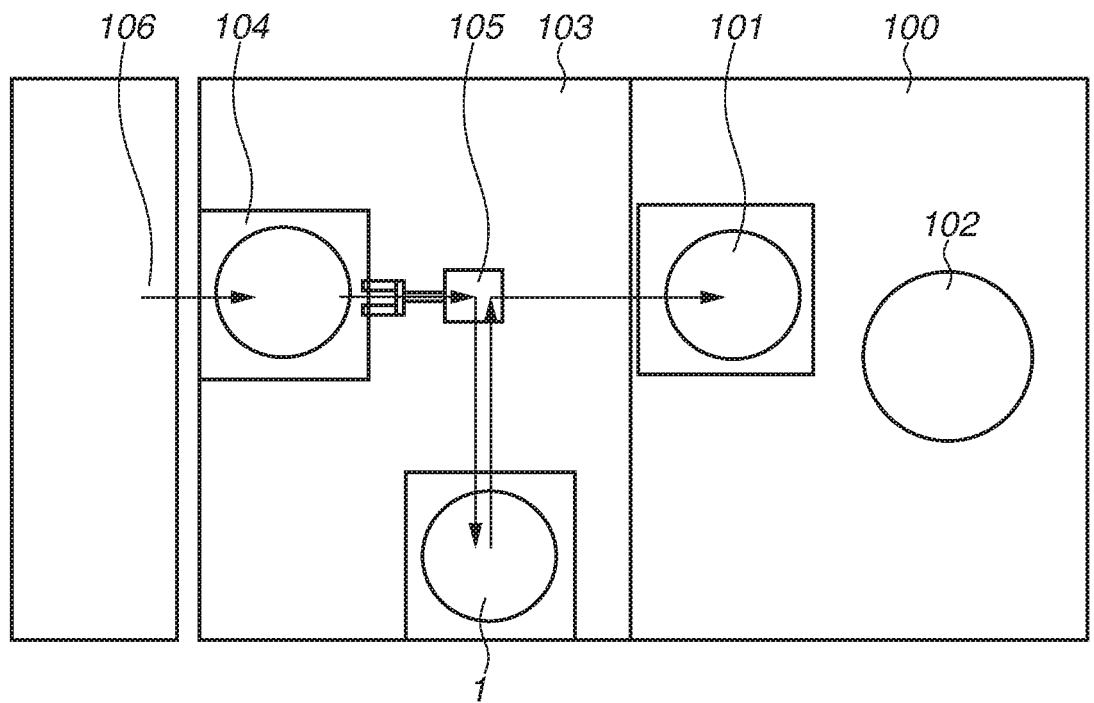
FIG. 6 is a diagram illustrating a processing apparatus according to the first exemplary embodiment of the present invention.

FIG. 6 illustrates a configuration of a processing apparatus 1000 according to an exemplary embodiment of the present invention. The processing apparatus 1000 may include the foreign substance inspection apparatus 1 and the forming apparatus 100. The forming apparatus 100 may be configured to perform forming processing to mold a composition on the substrate 3. In an example, the forming apparatus 100 may be configured as an imprint apparatus that uses a mold including a pattern to mold the composition (imprint material) on the substrate 3, in other words, as an imprint apparatus that transfers the pattern of the mold to the composition on the substrate 3. The imprint apparatus can form the pattern made of the cured composition on the substrate 3 by curing the composition while the composition on the substrate 3 and the mold are contacted. In another example, the forming apparatus 100 may be configured as a planarization apparatus that uses a mold (blank template) including a flat portion without an irregular pattern to planarize the composition on the substrate 3. The planarization apparatus can form a film that is made of a cured composition and has a flat upper surface on the substrate 3 by curing the composition while the composition on the substrate and the flat portion of the mold are contacted.

In the forming apparatus 100 may include a positioning mechanism 101 that positions the substrate 3, and a forming unit 102 that applies curing energy (e.g., UV light) to the composition while the composition on the substrate 3 and the mold are contacted, to cure the composition.

A conveyance chamber 103 may be coupled to the forming apparatus 100. An auxiliary apparatus 106 such as a coater/developer may be coupled to the conveyance chamber 103. The auxiliary apparatus 106 is an apparatus that disposes the composition on the substrate 3. The auxiliary apparatus 106 may supply the substrate 3 on which the composition has been disposed, to a station 104 inside the conveyance chamber 103. A conveyance mechanism 105 may convey the substrate 3 that has been supplied to the station 104, to the stage 2 of the foreign substance inspection apparatus 1. The foreign substance inspection apparatus 1 performs the foreign substance detection processing to detect a foreign substance present on the surface of the substrate 3. The substrate on which it is determined by the foreign substance inspection apparatus 1 that no foreign substance is present, may be conveyed by the conveyance mechanism 105 to the substrate positioning mechanism 101 of the forming apparatus 100. In contrast, the substrate on which it is determined by the foreign substance inspection apparatus 1 that a foreign substance is present, is returned to the auxiliary apparatus 106 or discharged through a discharge port (not illustrated) by the conveyance mechanism 105.

FIG. 6 illustrates the processing apparatus 1000 in which one forming apparatus 100 is coupled to one foreign substance inspection apparatus 1; however, a plurality of forming apparatuses may be coupled to one foreign substance inspection apparatus 1. A cluster processing apparatus 1000 in which a plurality of forming apparatuses 100 is coupled to one conveyance chamber 103 (foreign substance inspection apparatus 1) may be used. In this case, the result (detection result) of the foreign substance detection processing that detects a foreign substance in the foreign substance inspection apparatus 1 may be transmitted to the forming apparatus 100 to which the substrate is conveyed. Each of the forming apparatuses 100 can perform the forming processing with use of information about the position and the size of the foreign substance adhered to the substrate by acquiring the processing result (detection result) obtained by the foreign substance inspection apparatus 1.

<Configuration of Station>

Figure 7:
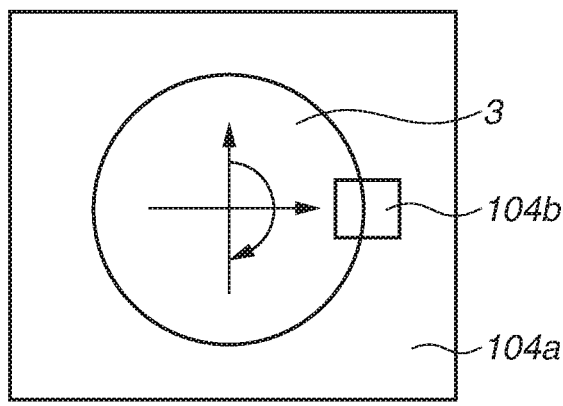
FIG. 7 is a diagram illustrating a configuration example of a station.

FIG. 7 illustrates a configuration example of the station 104. The station 104 may function as a measurement unit that includes a function of measuring an error relating to the position and rotation of the substrate 3, based on an outer shape of the substrate 3. For example, the station 104 may include a driving mechanism 104a that drives the substrate 3 in the X-axis direction, in the Y-axis direction, and around the Z-axis for rotation, and a substrate edge detector 104b. The substrate edge detector 104b detects an edge position of the substrate 3 and may include, for example, a line sensor. The substrate edge detector 104b detects the edge position of the substrate 3 while the driving mechanism 104a rotates the substrate 3. This makes it possible to determine orientation (notch position) of the substrate 3 and the outer shape of the substrate 3. Further, a center position of the substrate 3 is calculated based on the outer shape of the substrate 3, and the position (X, Y, Qz) of the substrate 3 is offset so as to enable the conveyance mechanism 105 to constantly receive the substrate 3 at the same position. As a result, the conveyance mechanism 105 can convey the substrate 3 with high positional accuracy.

The error relating to the position and rotation of the substrate 3 that is measured by the station 104 functioning as the measurement unit based on the outer shape of the substrate 3, may be used to specify a region to which light is applied in the measurement process in step S402 or step S405. In this way, the position of the substrate 3 can be accurately determined independently of variation of the outer shape and arrangement of the substrate 3. In this example, the outer shape of the substrate 3 is measured by the station 104; however, a function to rotate the stage 2 may be provided, and a substrate edge detector that detects the edge of the substrate 3 rotating together with the stage 2 may be provided.

<Manufacture of Article>

The pattern of the cured composition formed by the forming apparatus (imprint apparatus) is permanently used in at least a part of various kinds of articles or temporarily used to manufacture various kinds of articles. Examples of the article include an electric circuit device, an optical device, a micro-electronic-mechanical system (MEMS), a recording device, a sensor, and a mold. Examples of the electric circuit device includes a volatile or nonvolatile semiconductor memory such as a dynamic random access memory (DRAM), a static random access memory (SRAM), a flash memory, and a magnetic random access memory (MRAM), and a semiconductor device such as a large-scale integration (LSI), a charge-coupled device (CCD), an image sensor, and a field programmable gate array (FPGA). Examples of the optical device include a microlens, a light guide body, a waveguide, an antireflection film, a diffraction grating, a polarization device, a color filter, a light emitting device, a display, and a solar cell. Examples of the MEMS include a digital micromirror device (DMD), a microchannel, and an electromechanical conversion device. Examples of the recording device include an optical disc such as a compact disc (CD) and a digital versatile disc (DVD), a magnetic disk, a magnetooptical disk, and a magnetic head. Examples of the sensor include a magnetic sensor, an optical sensor, and a gyro sensor. Examples of the mold include an imprint mold.

The pattern of the cured composition is used as a constituent member of at least a part of the above-described articles, or is temporarily used as a resist mask. After etching, ion injection, or the like is performed in working process of the substrate, the resist mask is removed.

Figure 8A:
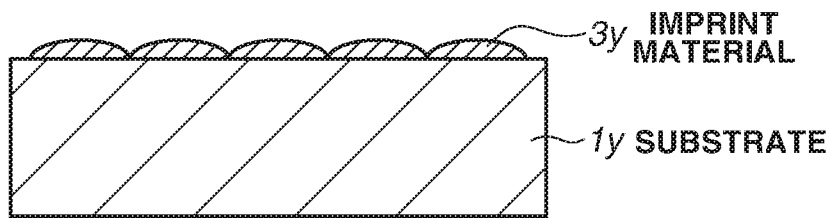
FIGS. 8A to 8D are diagrams illustrating an article manufacturing method.

Next, an article manufacturing method is described. As illustrated in FIG. 8A, a substrate 1y such as quartz glass is prepared, and an imprint material 3y is then provided on a surface of the substrate 1y by an inkjet method or the like.

As necessary, a layer of another material such as a metal and a metal compound may be provided on the surface of the substrate 1y. The substrate 1y is previously subjected to inspection of a foreign substance on the substrate by the foreign substance inspection apparatus 1, and a position of the foreign substance is specified if the foreign substance adheres. The article manufacturing method described here is performed on a region where no foreign substance adheres as a result of the inspection.

Figure 8B:
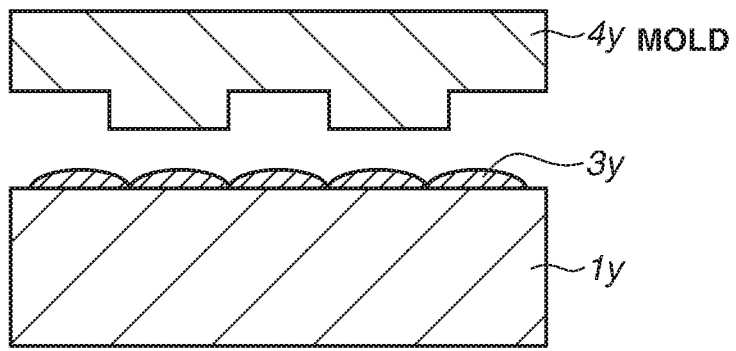
Figure 8C:
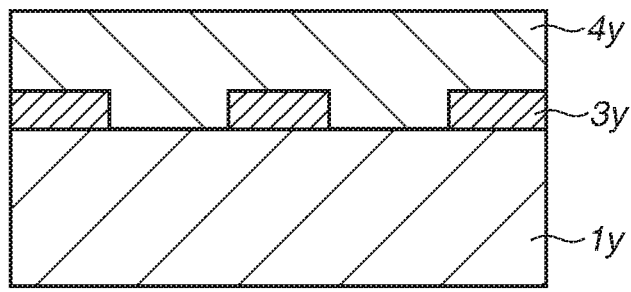

As illustrated in FIG. 8B, a side provided with an irregular pattern of an imprint mold 4y is directed to the imprint material 3y to face the imprint material 3y. As illustrated in FIG. 8C, the substrate 1y provided with the imprint material 3y and the mold 4y are brought into contact with each other, and pressure is applied thereto. A gap between the mold 4y and the substrate 1y is filled with the imprint material 3y. When light is applied through the mold 4y in this state, the imprint material 3y is cured.

Figure 8D:
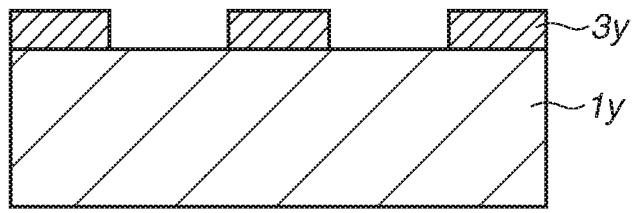

As illustrated in FIG. 8D, the mold 4y and the substrate 1y are separated after the imprint material 3y is cured, a pattern of a cured material of the imprint material 3y is formed on the substrate 1y. An article including the pattern of the cured material as a constituent member is thus obtained. When etching is performed on the substrate 1y with the pattern of the cured material as a mask in the state of FIG. 8D, an article in which a concave part and a convex part are inverted with respect to a concave part and a convex part of the mold 4y, for example, an imprint mold can be obtained.

Next, a method of manufacturing an article (e.g., semiconductor IC device, liquid crystal display device, or MEMS) through a process of exposing the substrate inspected by the foreign substance inspection apparatus 1 with light by the exposure apparatus is described. The article is manufactured using above-described exposure apparatus through processes of exposing with light a substrate (e.g., wafer or glass substrate) coated with a photosensitive material, of developing the substrate (photosensitive material), and of processing the developed substrate by the other well-known processing. The other well-known processing includes etching, resist removal, dicing, bonding, and packaging. The article manufacturing method according to the present exemplary embodiment makes it possible to manufacture an article with quality higher than an existing method.

While the exemplary embodiment of the present invention has been described above, the present invention is not limited to the above-described exemplary embodiment, and various modifications and alternations can be made within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-209096, filed Nov. 6, 2018, which is hereby incorporated by reference herein in its entirety.

What is claimed is:

1. A foreign substance inspection apparatus that detects a foreign substance on a substrate, the foreign substance inspection apparatus comprising:
   a detection unit including a light projector configured to project light to a surface of the substrate and a light receiver configured to receive scattered light from the surface; and
   a control unit configured to perform foreign substance detection on an inspection region on the substrate in a state where sensitivity of the detection unit is set to a first sensitivity, and to determine whether to perform foreign substance detection on the inspection region on which the foreign substance detection is performed in a state where the sensitivity of the detection unit is changed to a second sensitivity lower than the first sensitivity, based on a result of the foreign substance detection at first sensitivity.

2. The foreign substance inspection apparatus according to claim 1, further comprising a scanning mechanism configured to scan a position of light projected by the light projector on a surface of the substrate.

3. The foreign substance inspection apparatus according to claim 2, wherein the control unit controls light projection by the light projector so as to project the light to the surface of the substrate, based on scanning by the scanning mechanism.

4. The foreign substance inspection apparatus according to claim 1, wherein, in a case where a region where a measurement value of the detection unit exceeds a threshold is present on the substrate as a result of the foreign substance detection performed in a state where the sensitivity of the detection unit is set to the first sensitivity, the control unit performs foreign substance detection on the region in a state where the sensitivity of the detection unit is set to the second sensitivity.

5. The foreign substance inspection apparatus according to claim 4, wherein the control unit performs the foreign substance detection in a state where the sensitivity of the detection unit is set to the second sensitivity, and determines a position and a size of a foreign substance on the substrate based on a result of the foreign substance detection with the second sensitivity.

6. The foreign substance inspection apparatus according to claim 1, wherein the first sensitivity of the detection unit in the detection processing is sensitivity that enables measurement of a foreign substance having a minimum particle diameter detectable by the foreign substance inspection apparatus.

7. A processing apparatus that processes a substrate, the processing apparatus comprising:
   the foreign substance inspection apparatus that is configured to detect a foreign substance on the substrate according to claim 1; and
   a forming apparatus configured to perform forming processing to mold a composition on the substrate with use of a result of foreign substance detection by the foreign substance inspection apparatus.

8. The processing apparatus according to claim 7, wherein another forming apparatus is further provided with respect to the foreign substance inspection apparatus.

9. The processing apparatus according to claim 7, wherein the forming apparatus forms the composition on the substrate based on a position of a foreign substance on the substrate detected by the foreign substance inspection apparatus.

10. An article manufacturing method, comprising:
   forming the composition on the substrate that has been subjected to foreign substance detection by the processing apparatus according to claim 7; and
   processing the substrate on which the composition has been formed.

11. The foreign substance inspection apparatus according to claim 1, further comprising an adjustment mechanism configured to adjust a light quantity of the scattered light received by the light receiver.

12. The foreign substance inspection apparatus according to claim 11, wherein the adjustment mechanism adjusts a light quantity of the light projected by the light projector to adjust the light quantity of the scattered light received by the light receiver.

13. The foreign substance inspection apparatus according to claim 11, wherein the adjustment mechanism adjusts the light quantity of the scattered light received by the light receiver with use of a neutral density (ND) filter disposed in an optical path from the light projector to the light receiver.

14. The processing apparatus according to claim 7, further comprising a control unit configured to control the processing apparatus, wherein the control unit determines whether to perform the foreign substance detection with the second sensitivity based on a result of the foreign substance detection with the first sensitivity, and determines whether to perform the forming processing on the substrate based on a result of the foreign substance detection with the second sensitivity.

* * * * *